_(12)_ United States Patent
Son

(10) Patent No.: US 9,183,909 B2
(45) Date of Patent: Nov. 10, 2015

(54) NON-VOLATILE SEMICONDUCTOR MEMORY DEVICE

(75) Inventor: Jong-pil Son, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 489 days.

(21) Appl. No.: 13/585,449

(22) Filed: Aug. 14, 2012

(65) Prior Publication Data

US 2013/0051132 A1 Feb. 28, 2013

(30) Foreign Application Priority Data

Aug. 22, 2011 (KR) ........................ 10-2011-0083578

(51) Int. Cl.
*G11C 11/00* (2006.01)
*G11C 11/16* (2006.01)
*G11C 7/24* (2006.01)

(52) U.S. Cl.
CPC . *G11C 11/16* (2013.01); *G11C 7/24* (2013.01)

(58) Field of Classification Search
CPC ................................. G11C 11/16; G11C 7/24
USPC ........... 365/158, 148, 189.15, 189.16, 189.05
See application file for complete search history.

(56) References Cited

U.S. PATENT DOCUMENTS

| 7,260,002 | B2 | 8/2007 | Choi et al. |
| 7,486,576 | B2 | 2/2009 | Choi et al. |
| 8,111,538 | B2 | 2/2012 | Hosotani et al. |
| 2005/0002219 | A1 | 1/2005 | Choi et al. |
| 2007/0263461 | A1 | 11/2007 | Choi et al. |
| 2009/0129141 | A1* | 5/2009 | Hosotani et al. ............... 365/148 |

FOREIGN PATENT DOCUMENTS

| JP | 2006-127648 | 5/2006 |
| JP | 2009-129491 | 6/2009 |
| KR | 10-0560665 | 3/2006 |

* cited by examiner

*Primary Examiner* — Richard Elms
*Assistant Examiner* — Mohammed A Bashar
(74) *Attorney, Agent, or Firm* — Onello & Mello, LLP

(57) ABSTRACT

A non-volatile semiconductor memory device includes: a power supply unit; a memory cell array powered on or off by the power supply unit; and a read unit for reading data recorded on the memory cell array, wherein the data recorded on the memory cell array is not read in response to a control signal, when the memory cell array is powered on or off.

20 Claims, 16 Drawing Sheets

FIG. 1B
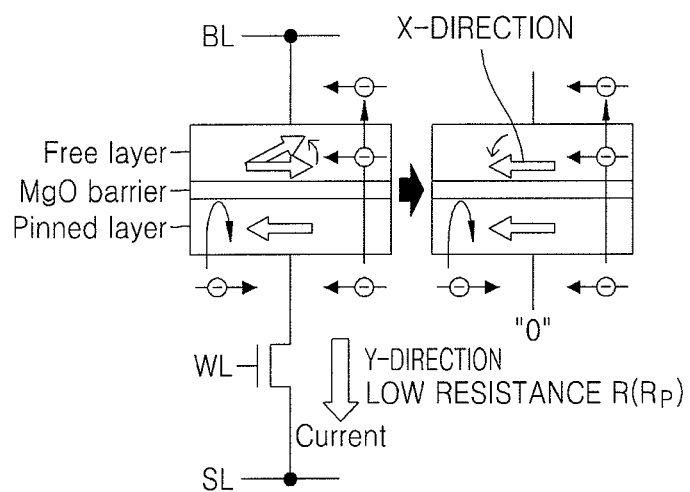
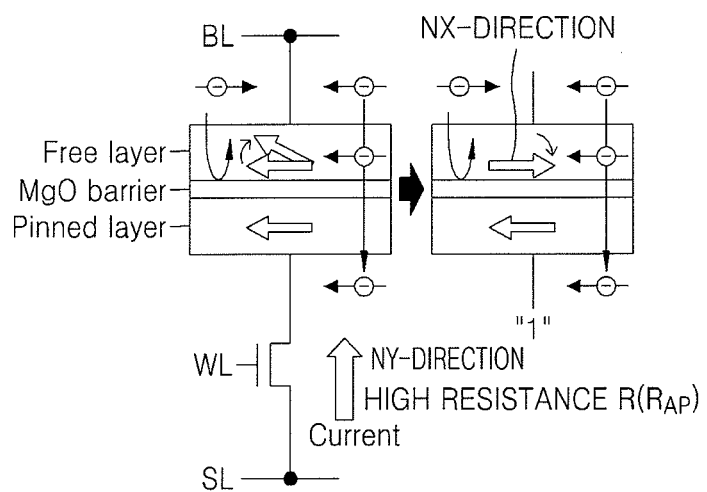

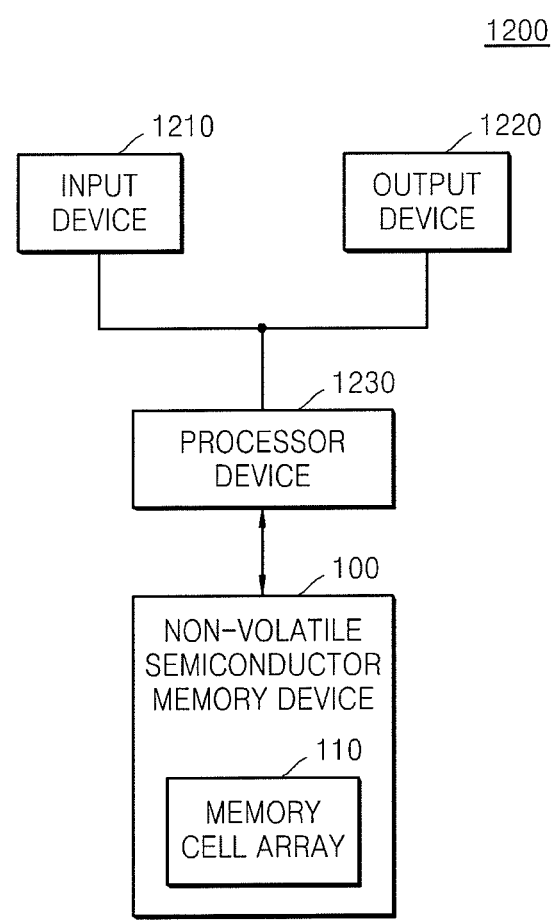

NON-VOLATILE SEMICONDUCTOR MEMORY DEVICE

CROSS-REFERENCE TO RELATED APPLICATIONS

This application claims the benefit of Korean Patent Application No. 10-2011-0083578, filed on Aug. 22, 2011, in the Korean Intellectual Property Office, the disclosure of which is incorporated herein in its entirety by reference.

FIELD OF INVENTION

The inventive concept or concepts relate to a non-volatile semiconductor memory device having security, and more particularly, to a protective device of a non-volatile semiconductor memory that prevents data recorded on a memory cell array from being read after power on or power off.

BACKGROUND

A magnetic random access memory (MRAM) that is receiving attention as next generation semiconductor technology is replacing a dynamic random access memory (DRAM) having integration limitations. However, while the non-volatility aspects of MRAM devices may be advantageous in terms of schedule, it may be disadvantageous in terms of security. For example, when a computer terminal is powered off and powered on again the user data of a user remains substantially unchanged when transitioning from power on to power off and back to power on. As a result, another user may have an opportunity to steal personal information, such as credit information, of the user. Accordingly, the security of the non-volatile semiconductor memory needs to be improved.

SUMMARY

The inventive concept provides a non-volatile semiconductor memory having security. According to the inventive concept, the reading of data in a non-volatile memory device can be suppressed, e.g., not read and/or output by a read unit, during power on and off of the non-volatile memory device.

According to an aspect of the inventive concept, there is provided a non-volatile semiconductor memory device including a power supply unit configured to output a control signal in response to a power on or off signal, a memory cell array configured to be powered on and/or off by the power supply on or off signal and to receive the control signal, and a read unit configured to read data recorded in the memory cell array. The read unit is also configured to suppress output of at least some of the data recorded in the memory cell array when the control signal is provided to the memory cell array in combination with the power on or off signal.

In some embodiments, the non-volatile semiconductor memory device may be a magnetic random access memory (MRAM).

In some embodiments, the memory cell array can be configured to delete at least some of the data recorded in the memory cell array in response to the control signal in combination with the power on or off signal.

In some embodiments, the non-volatile semiconductor memory device can further comprise a buffer coupled to the memory cell array, wherein the data deleted from the memory cell array is stored in the buffer in response to the control signal in combination with the power on or off signal.

In some embodiments, data having a predetermined pattern can be recorded in the non-volatile semiconductor memory device in response to the control signal in combination with the power on or off signal.

In some embodiments, the memory cell array can be configured to suppress reading of the data recorded in the memory cell array when the data having the predetermined pattern is output by the memory cell array in response to the control signal in combination with the power on or off signal.

In some embodiments, only a part of the data recorded on the memory cell array is suppressed from being read in response to the control signal in combination with the power on or off signal.

In some embodiments, the non-volatile semiconductor memory device may further include a plurality of index units. Each of the plurality of index units can be configured to indicate a certain region of the memory cell array and each certain region of the memory cell array can correspond to a value indicated in each of the plurality of index units, and thus data recorded on the certain region of the memory cell array is not read.

In some embodiments, the plurality of index units may be initialized by a signal generated by the memory cell array in response to power on or off signal.

In some embodiments, the plurality of index units may be initialized by an external signal.

In some embodiments, the plurality of index units may indicate a page unit in the memory cell array.

According to another aspect of the inventive concept, there is provided a non-volatile semiconductor memory system including a power supply unit, a memory cell array configured to be powered on or off by the power supply unit, a read unit configured to read data recorded on the memory cell array, and a controller configured to control the power supply unit and the memory cell array and to output a control signal in response to a power on or off signal. The read unit is also configured to suppress output of at least some of the data recorded in the memory cell array when the control signal is provided to the memory cell array.

In some embodiments, the memory cell array can be configured to delete at least some of the data recorded in the memory cell array in response to the control signal when the memory cell array is powered on or off when the memory cell array is powered on or off.

In some embodiments, the memory cell array can be configured to suppress reading of the data recorded in the memory cell array when the data having a predetermined pattern is output by the memory cell array in response to the control signal, when the memory cell array is powered on or off.

The non-volatile semiconductor memory system may further include a plurality of index units, wherein each of the plurality of index units can be configured to indicate a certain region of the memory cell array and each certain region of the memory cell array corresponds to a value indicated in each of the plurality of index units, and thus reading of data recorded on the certain region of the memory cell array is suppressed.

According to another aspect of the invention, provided is a method of preventing the reading of data from a non-volatile semiconductor memory device during power on and power off. The method includes: providing a non-volatile semiconductor device including a power supply unit, a memory cell array configured to be powered on and off by the power supply unit, and a read unit configured to read data recorded in the memory cell array; recording data in the memory cell array; generating a control signal in response to a power on or off signal indicating the memory cell array being powered on or off; and suppressing reading of at least some of the data recorded in the memory cell array in response to the control signal in combination with the power on or off signal.

In some embodiments, the non-volatile semiconductor memory device can be a magnetic random access memory (MRAM).

In some embodiments, the method can further comprise suppressing the reading of the data recorded in the memory cell array when deleting at least some of the data from the memory cell array, when the memory cell array is powered on or off.

In some embodiments, the method can further comprise storing data having a predetermined pattern in the non-volatile semiconductor memory device, when the memory cell array is powered on or off.

In some embodiments, the method can further comprise reading the data having the predetermined pattern while suppressing the reading of the data recorded in the memory cell array, when the memory cell array is powered on or off.

BRIEF DESCRIPTION OF THE DRAWINGS

The inventive concept will be more clearly understood from the following detailed description taken in conjunction with the accompanying drawings depicting exemplary embodiments in accordance therewith, in which:

FIG. 1B is a diagram for describing an embodiment of a recording operation of a magnetic random access memory (MRAM), according to aspects of the inventive concept;

FIG. 12 is a block diagram of an embodiment of an electronic system including a non-volatile semiconductor memory device, according to aspects of the inventive concept;

DETAILED DESCRIPTION OF THE EMBODIMENTS

Figure 1A:
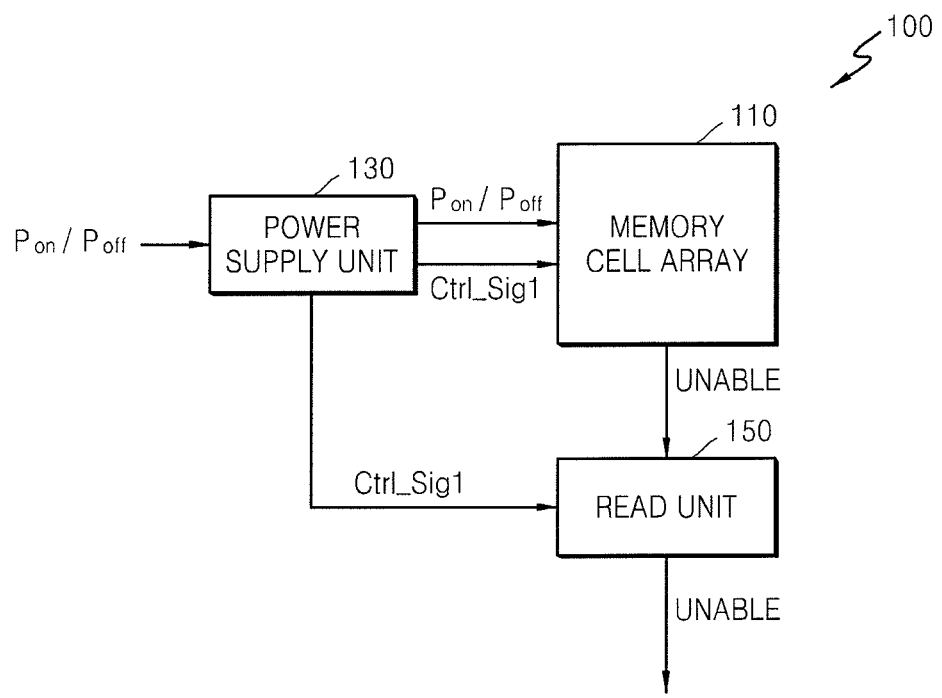
FIG. 1A is a block diagram of an embodiment of a non-volatile semiconductor memory device, according to aspects of the inventive concept.

Hereinafter, exemplary embodiments will be described in detail with reference to the attached drawings. Like reference numerals in the drawings denote like elements, and sizes of elements may be enlarged or reduced for the purpose of improving clarity.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While such terms as "first," "second," etc., may be used to describe various components, such components are not intended to be limited to the above terms. The above terms are used only to distinguish one component from another. For example, a first element may be named a second element and a second element may be named a first element without deviating from the meaning of this disclosure or the scope of the inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Notwithstanding the foregoing, terms used herein should be interpreted in a manner that is consistent with the context of the inventive concept and this specification.

FIG. 1A is a block diagram of an embodiment of a non-volatile semiconductor memory device 100, according to aspects of the inventive concept.

Referring to the embodiment of FIG. 1A, the non-volatile semiconductor memory device 100 includes a memory cell array 110, a power supply unit 130, and a read unit 150.

The non-volatile semiconductor memory device 100 may be a magnetic random access memory (MRAM). The MRAM has a basic structure where upper and lower ferromagnetic substances are disposed between overlapping conductors and an insulating layer is disposed between the upper and lower ferromagnetic substances.

FIG. 1B is a diagram for describing an embodiment of a recording operation of an MRAM, such as that in FIG. 1A. In FIG. 1B, each free layer can comprise an upper ferromagnetic substance and each pinned layer can comprise lower ferromagnetic substance. The upper and lower ferromagnetic substances can be formed from the same ferromagnetic substance. An insulating layer, such as an MgO barrier layer, can be disposed between the free layer and pinned layer. The free layer can be coupled to a bit line BL and the pinned layer can be coupled to a word line WL and a select line SL.

Referring to the embodiment of FIG. 1B, the upper and lower ferromagnetic substances are in a '0' state when magnetization directions are the same, and are in a '1' state when magnetization directions are different. Accordingly, a current direction of a conductive layer connected to the ferromagnetic substance is determined to be in a Y-direction so that the magnetization directions of the upper and lower ferromagnetic substances match while recording '0' data on a memory cell, and the current direction is determined to be in an NY-direction, opposite to the Y-direction, while recording '1' data on the memory cell. When '0' data is recorded, since the magnetization directions are in an X-direction, the MRAM has a low resistance value Rp. And when '1' data is recorded, since the magnetization directions are different in NX-directions, the MRAM has a high resistance value Rap. Accordingly, recorded data may be read based on a resistance value between upper and lower ferromagnetic substances. Accordingly, the magnetization directions of the upper and lower ferromagnetic substances do not change according to time, and the resistance values according to the magnetization directions do not change according to time. Thus, the MRAM is a non-volatile memory device to which the inventive concept can be applied.

Referring back to FIG. 1A, the power supply unit 130 receives a power on or off signal Pon/Poff from a source external to the non-volatile semiconductor memory device 100. The power supply unit 130 powers on or off the memory cell array 110 in response to the power on or off signal Pon/Poff. Since it takes a long period of time, e.g., about several years, for data to be deleted from a non-volatile memory, data pre-recorded before powering on or off may remain on the memory cell array 110. The power supply unit 130 according to the current embodiment generates a first control signal Ctrl_Sig1 in response to the power on or off signal Pon/Poff. For example, the power supply unit 130 may generate the first control signal Ctrl_Sig1 in response to detecting the power on signal Pon. Alternatively, the power supply unit 130 may generate the first control signal Ctrl_Sig1 in response to detecting the power off signal Poff.

The power supply unit 130 inputs the first control signal Ctrl_Sig1 to the memory cell array 110 or the read unit 150 so that data recorded on the memory cell array 110 is suppressed, e.g., not read or output by the reading unit.

The read unit 150 reads data from the memory cell array 110 and provides the data to a device or element external to the non-volatile semiconductor memory device 100. However, the read unit 150, according to the current embodiment, may not read the data recorded in the memory cell array 110 when the power on or off signal Pon/Poff and the first control signal Ctrl_Sig1 are both input to the memory cell array 110, depending on the value or level of the first control signal Ctrl_Sig1.

Figure 2:
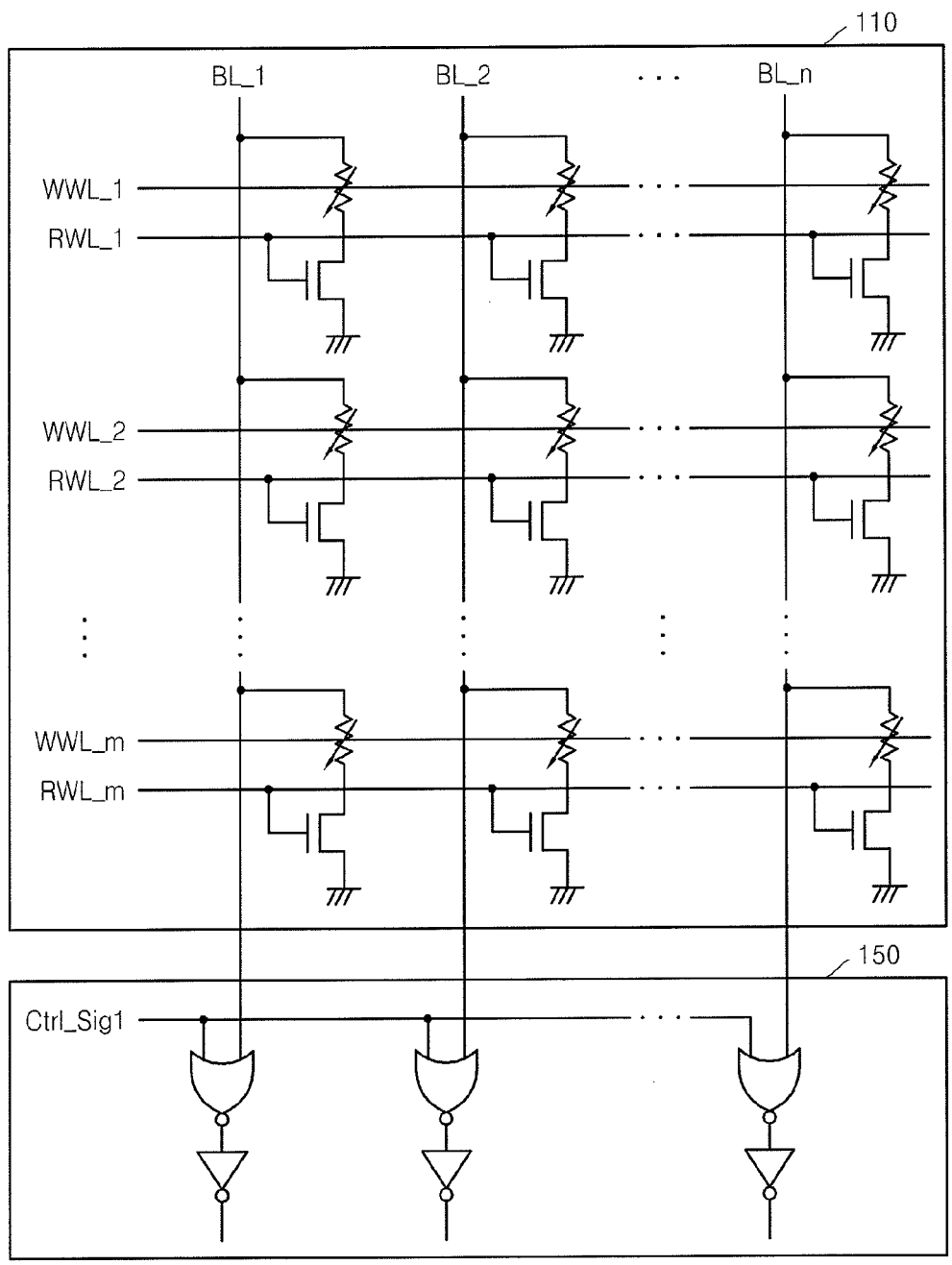
FIG. 2 is a diagram showing an embodiment of a detailed structure of a memory cell array and a read unit when the non-volatile semiconductor memory device is an MRAM, according to aspects of the inventive concept.

FIG. 2 is a diagram showing an embodiment of a detailed structure of the memory cell array 110 and the read unit 150 when the non-volatile semiconductor memory device 100 is an MRAM.

Referring to the embodiment of FIG. 2, the memory cell array 110 includes "n" number of bit lines BL_1 through BL_n, "m" number of write word lines WWL_1 through WWL_m, and m number of read word lines RWL_1 through RWL_m. When the m read word lines RWL_1 through RWL_m power on a transistor of a corresponding word line, data corresponding to "0" or "1" is read according to a resistance value. Upon receiving the first control signal Ctrl_Sig1, the read unit 150, according to the current embodiment, may output to each read bit line and perform a logical OR operation. Here, if the first control signal Ctrl_Sig1 is "0", each data may be read. However, when the first control signal Ctrl_Sig1 is "1", each data is or suppressed or not read, but all data may be read as "1". Accordingly, when the first control signal Ctrl_Sig1 is "1", data recorded on the memory cell array 110 is suppressed or not read, e.g., during power on or off operations.

Referring back to FIG. 1A, the power supply unit 130 receives the power on or off signal Pon/Poff from a source external to the non-volatile semiconductor memory device 100. The power on or off signal Pon/Poff powers on or off the memory cell array 110. Here, the first control signal Ctrl_Sig1 is input to the memory cell array 110 so that the data recorded on the memory cell array 110 is suppressed or not read. Accordingly, the security of the non-volatile semiconductor memory device 100 may be improved.

Figure 3:
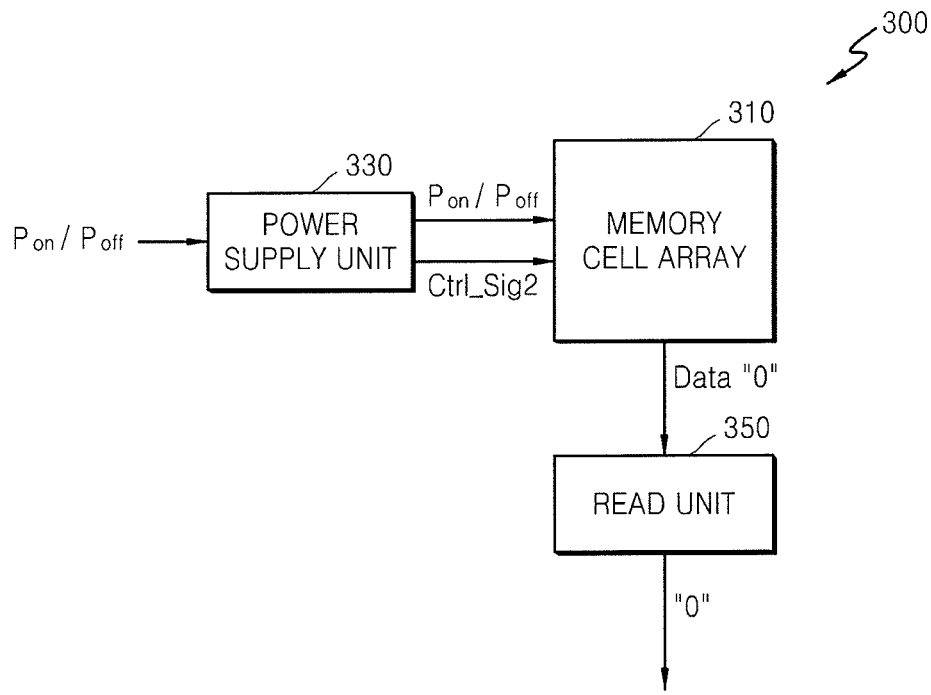
FIG. 3 is a block diagram of another embodiment of a non-volatile semiconductor memory device, according to aspects of the inventive concept.

FIG. 3 is a block diagram of another embodiment of a non-volatile semiconductor memory device 300, according to aspects of the inventive concept.

Referring to the embodiment of FIG. 3, the non-volatile semiconductor memory device 300 includes a memory cell array 310, a power supply unit 330, and a read unit 350. The memory cell array 310, the power supply unit 330, and the read unit 350 respectively perform substantially the same operations as the memory cell array 110, the power supply unit 130, and the read unit 150 of the embodiment of FIG. 1A. However, the power supply unit 330 according to the current embodiment generates a second control signal Ctrl_Sig2 in response to the power on or off signal Pon/Poff. The second control signal Ctrl_Sig2 is input to the memory cell array 310 to delete data recorded on the memory cell array 310.

Figure 4:
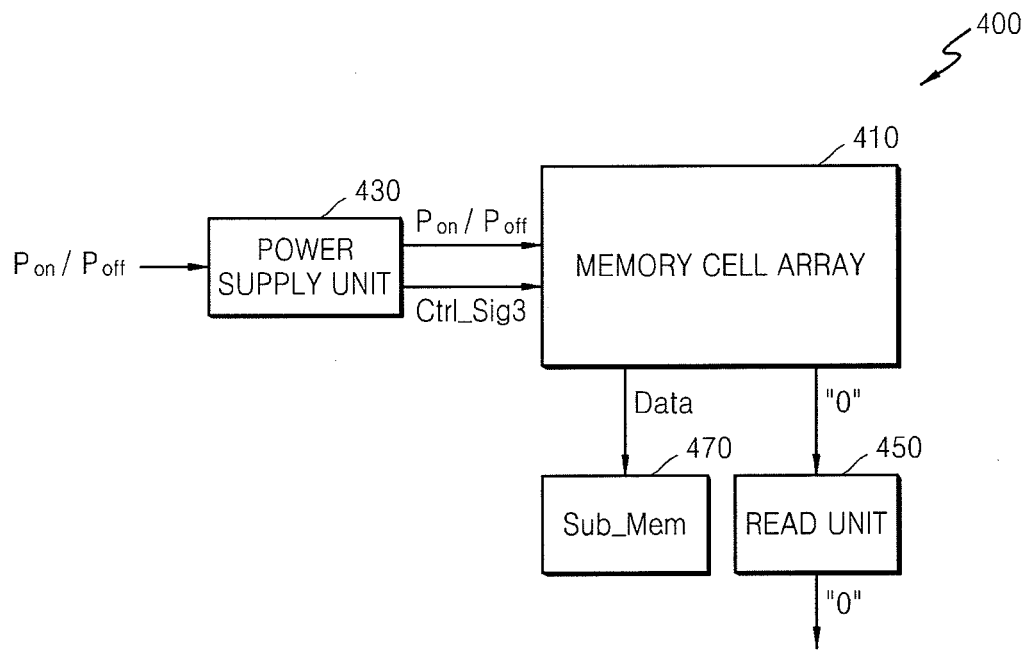
FIG. 4 is a block diagram of another embodiment of a non-volatile semiconductor memory device, according to aspects of the inventive concept.

FIG. 4 is a block diagram of an embodiment of a non-volatile semiconductor memory device 400, according to aspects of the inventive concept.

Referring to the embodiment of FIG. 4, the non-volatile semiconductor memory device 400 includes a memory cell array 410, a power supply unit 430, and a read unit 450. The memory cell array 410, the power supply unit 430, and the read unit 450 respectively perform substantially the same operations as the memory cell array 110, the power supply unit 130, and the read unit 150 of the embodiment of FIG. 1A. Also, the non-volatile semiconductor memory device 400 further includes a subsidiary memory 470. The subsidiary memory 470 may be an MRAM, as an example. However, the subsidiary memory 470 is not limited thereto, and may be a random access memory (RAM), a read only memory (ROM), or any other semiconductor memory.

The power supply unit 430 according to the current embodiment generates a third control signal Ctrl_Sig3 in response to the power on or off signal Pon/Poff. The third control signal Ctrl_Sig3 is input to the memory cell array 410 so that data stored in the memory cell array 410 is recorded and stored in the subsidiary memory 470. At the same time or afterwards, the data stored in the memory cell array 410 is deleted. Accordingly, the data stored in the memory cell array 410 is secured, but is prevented from being read, thereby increasing security.

Figure 5A:
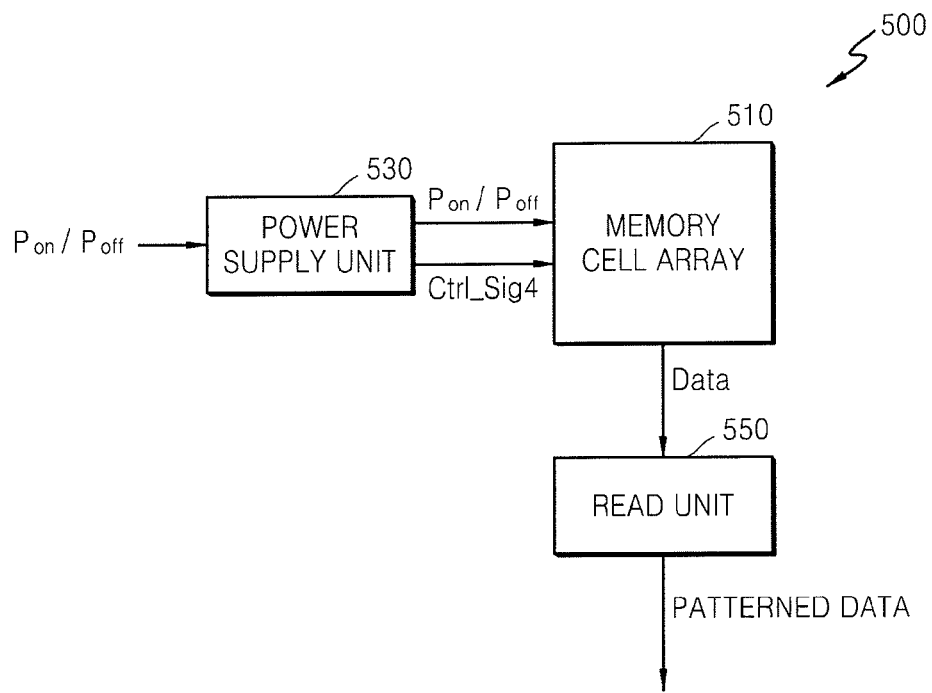
FIG. 5A is a block diagram of another embodiment of a non-volatile semiconductor memory device, according to aspects of the inventive concept.

FIG. 5A is a block diagram of another embodiment of a non-volatile semiconductor memory device 500 according to aspects of the inventive concept.

Referring to the embodiment of FIG. 5A, the non-volatile semiconductor memory device 500 includes a memory cell array 510, a power supply unit 530, and a read unit 550. The memory cell array 510, the power supply unit 530, and the read unit 550 respectively perform substantially the same operations as the memory cell array 110, the power supply unit 130, and the read unit 150 of the embodiment of FIG. 1. However, the power supply unit 530 according to the current embodiment generates a fourth control signal Ctrl_Sig4 in response to the power on or off signal Pon/Poff. The power supply unit 530 inputs the fourth control signal Ctrl_Sig4 to the memory cell array 510 so that data recorded on the memory cell array 510 is suppressed or not read. The fourth control signal Ctrl_Sig4 may include information about patterned data so that the patterned data is read by the read unit 550. Accordingly, the data of the memory cell array 510 may be secured and the patterned data may be read. Patterned data may be, for example, patterns of ones and zeros.

Figure 5B:
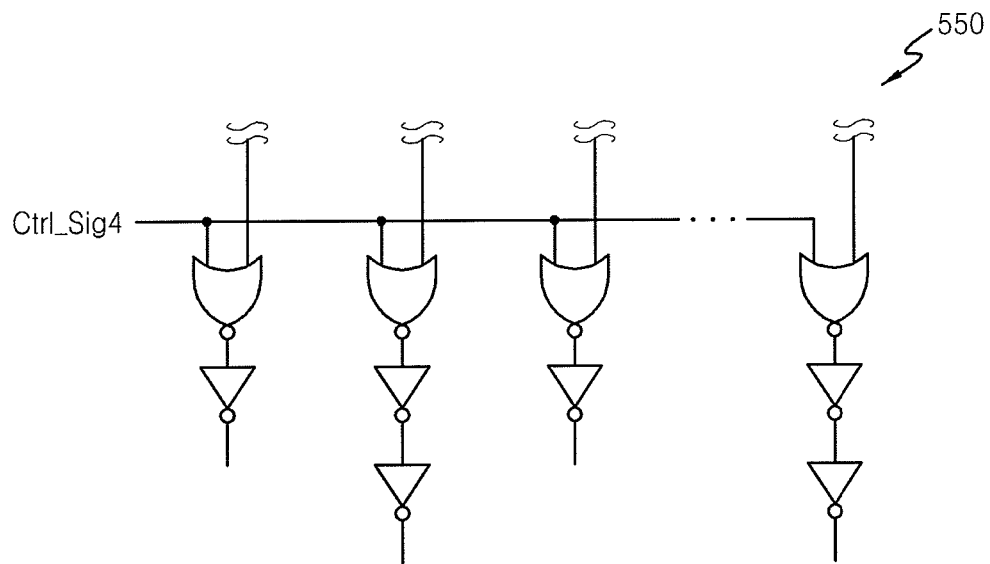
FIG. 5B is an embodiment of a circuit diagram of a read unit included in the non-volatile semiconductor memory device of FIG. 5A, according to aspects of the inventive concept.

FIG. 5B is an embodiment of a circuit diagram of the read unit 550 included in the non-volatile semiconductor memory device 500 of FIG. 5A, according to aspects of the inventive concept.

Referring to the embodiment of FIG. 5B, the read unit 550 is similar to the read unit 150 of the embodiment of FIG. 2. Upon receiving the fourth control signal Ctrl_Sig4, the read unit 550 may output to each read bit line and perform an OR operation. Here, when the fourth control signal Ctrl_Sig4 is "1", each data is suppressed or not read, but "1010" is read. In other words, when the fourth control signal Ctrl_Sig4 is "1", the read unit 550 may read the patterned data.

Figure 6:
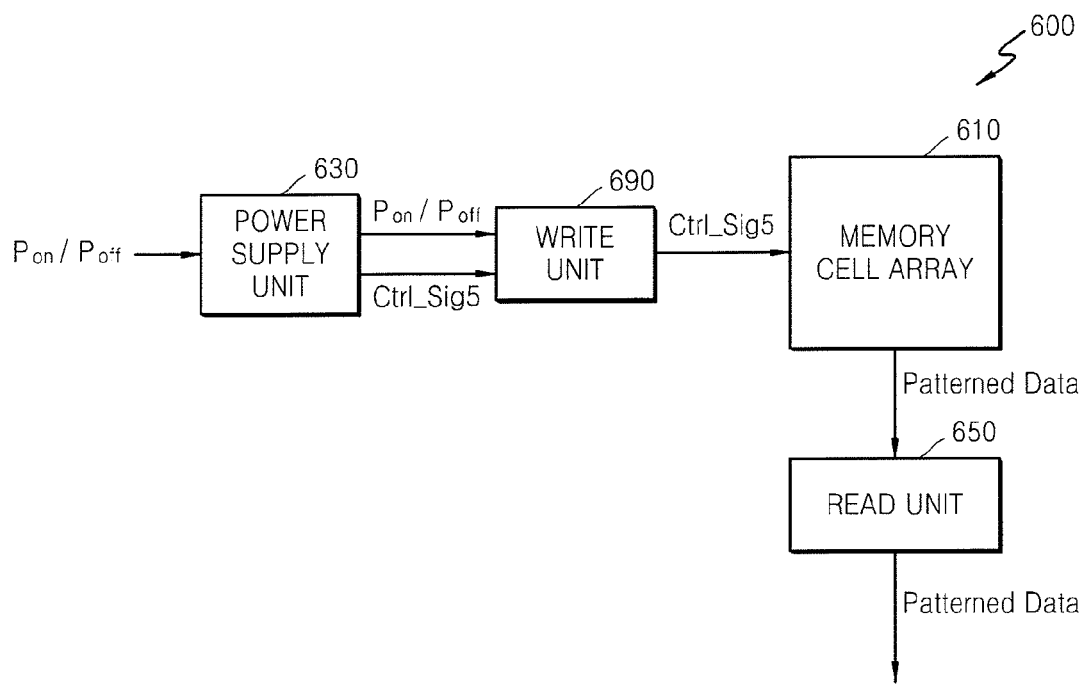
FIG. 6 is a block diagram of another embodiment of a non-volatile semiconductor memory device, according to aspects of the inventive concept.

FIG. 6 is a block diagram of another embodiment of a non-volatile semiconductor memory device 600, according to aspects of the inventive concept.

Referring to the embodiment of FIG. 6, the non-volatile semiconductor memory device 600 includes a memory cell array 610, a power supply unit 630, and a read unit 650. The memory cell array 610, the power supply unit 630, and the read unit 650 respectively perform substantially the same operations as the memory cell array 110, the power supply unit 130, and the read unit 150 of the embodiment of FIG. 1A. The non-volatile semiconductor memory device 600 further includes a write unit 690. The power supply unit 630 according to the current embodiment generates a fifth control signal Ctrl_Sig5 in response to the power on or off signal Pon/Poff. The power supply unit 630 inputs the fifth control signal Ctrl_Sig5 to the write unit 690. The fifth control signal Ctrl_Sig5 includes information about patterned data. The write unit 690 records the patterned data on the memory cell array 610, and thus the read unit 650 may read the patterned data from the memory cell array 610.

Figure 7:
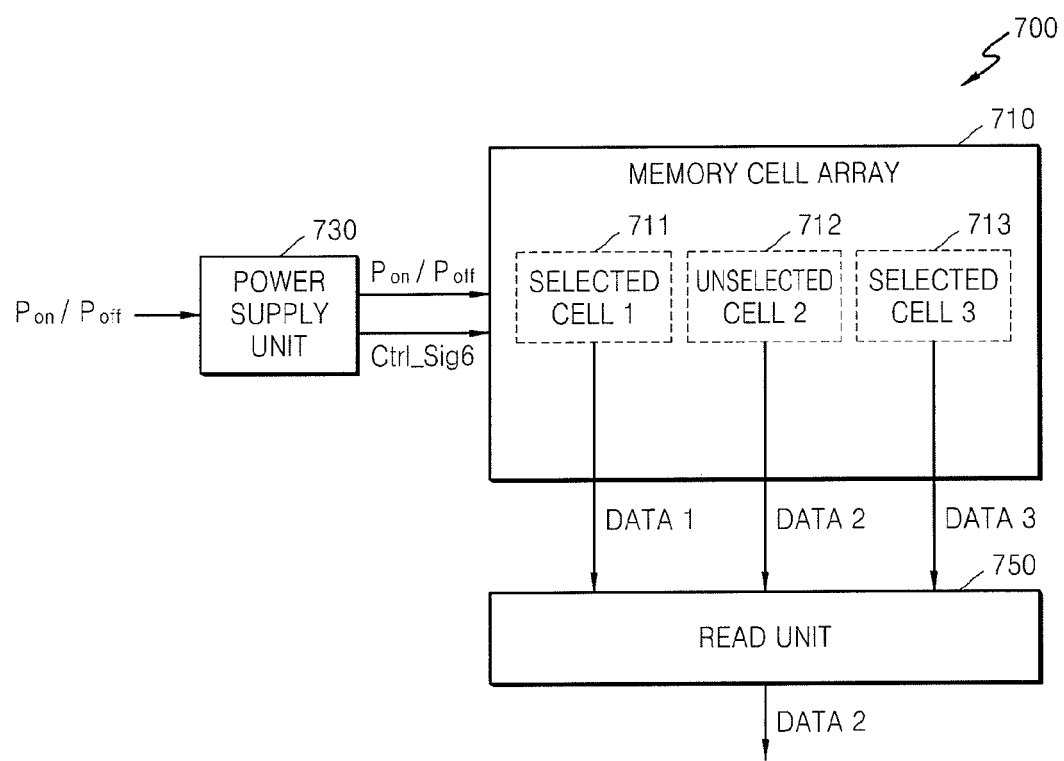
FIG. 7 is a block diagram of an embodiment of a non-volatile semiconductor memory device, according to aspects of the inventive concept.

FIG. 7 is a block diagram of another embodiment of a non-volatile semiconductor memory device 700, according to aspects of the inventive concept.

Referring to the embodiment of FIG. 7, the non-volatile semiconductor memory device 700 includes a memory cell array 710, a power supply unit 730, and a read unit 750. The memory cell array 710, the power supply unit 730, and the read unit 750 respectively perform substantially the same operations as the memory cell array 110, the power supply unit 130, and the read unit 150 of the embodiment of FIG. 1A. The power supply unit 730 according to the current embodiment generates a sixth control signal Ctrl_Sig6 in response to the power on or off signal Pon/Poff. The sixth control signal Ctrl_Sig6 includes information about a selected cell. Here, the selected cell is a partial memory cell of the memory cell array 710. The memory cell array 710 may include a selected first cell 711, an unselected second cell 712, and a selected third cell 713. The read unit 750 does not read data DATA1 and DATA3 of the selected first and third cells 711 and 713, and only reads data DATA2 of the unselected second cell 712. The number of cells in the memory cell array 710 is 3 in the current embodiment, but is not limited thereto.

Figure 8A:
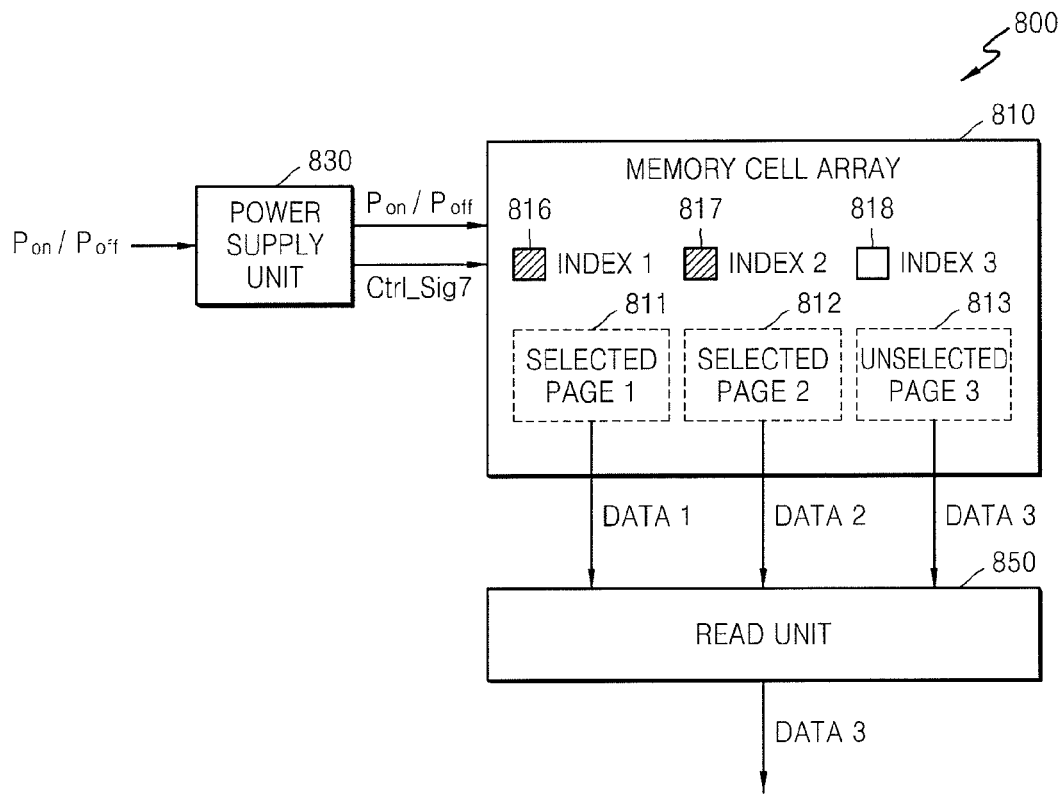
FIG. 8A is a block diagram of another embodiment of a non-volatile semiconductor memory device, according to aspects of the inventive concept.

FIG. 8A is a block diagram of another embodiment of a non-volatile semiconductor memory device 800, according aspects of the inventive concept.

Referring to the embodiment of FIG. 8A, the non-volatile semiconductor memory device 800 includes a memory cell array 810, a power supply unit 830, and a read unit 850. The memory cell array 810, the power supply unit 830, and the read unit 850 respectively perform substantially the same operations as the memory cell array 110, the power supply unit 130, and the read unit 150 of the embodiment of FIG. 1A. The memory cell array 810 of the non-volatile semiconductor memory device 800 includes index units 816 through 818. The index unit 816 indicates selecting of a first page 811, the index unit 817 indicates selecting of a second page 812, and the index unit 818 indicates selecting of a third page 813. The number of index units 816 through 818 is 3 in the current embodiment, but one or more embodiments of the present invention are not limited thereto. The power supply unit 830 according to the current embodiment generates a seventh control signal Ctrl_Sig7 in response to the power on or off signal Pon/Poff. The seventh control signal Ctrl_Sig7 input from the power supply unit 830 to the memory cell array 810 includes information about the index units 816 through 818. In the current embodiment, the first and second pages 811 and 812 are selected, and thus data DATA1 and DATA2 of the first and second pages 811 and 812 are suppressed or not read. Thus, the read unit 850 only reads data DATA3 of the third page 813.

Figure 8B:
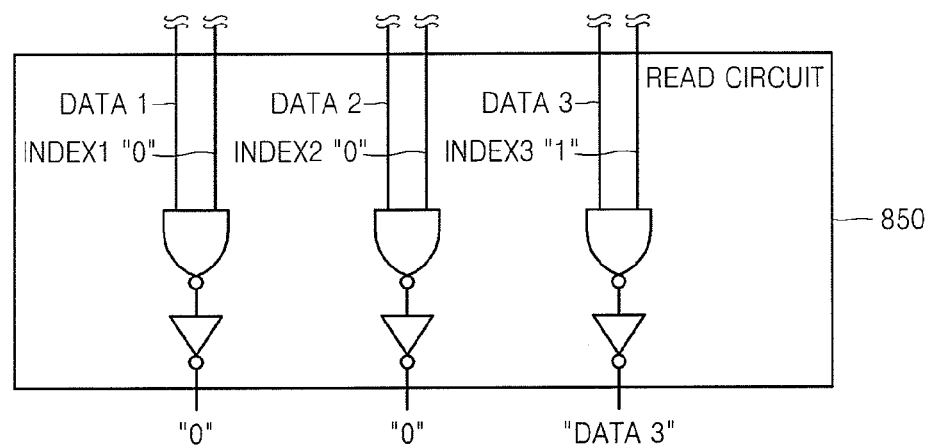
FIG. 8B is a circuit diagram showing in detail an embodiment of a read unit, according to aspects of the inventive concept.

FIG. 8B is a circuit diagram showing an embodiment, in detail, of the read unit 850. The index unit 816 stores "0", and thus "0" is always input as a logical multiply (AND) operation is performed on the data DATA1 and "0" stored in the index unit 816. The index unit 817 also stores "0", and thus an output of an AND operation is always "0" regardless of the data DATA2, like the data DATA1. The index unit 817 stores "1", and thus a value identical to the data DATA3 is output as an AND operation is performed on the data DATA3 and "1" stored in the index unit 818. Accordingly, the read unit 850 only outputs information about the data DATA3. As such, data is determined to be read by the read unit 850 according to an index value, and thus designated partial data may not be read.

Figure 9:
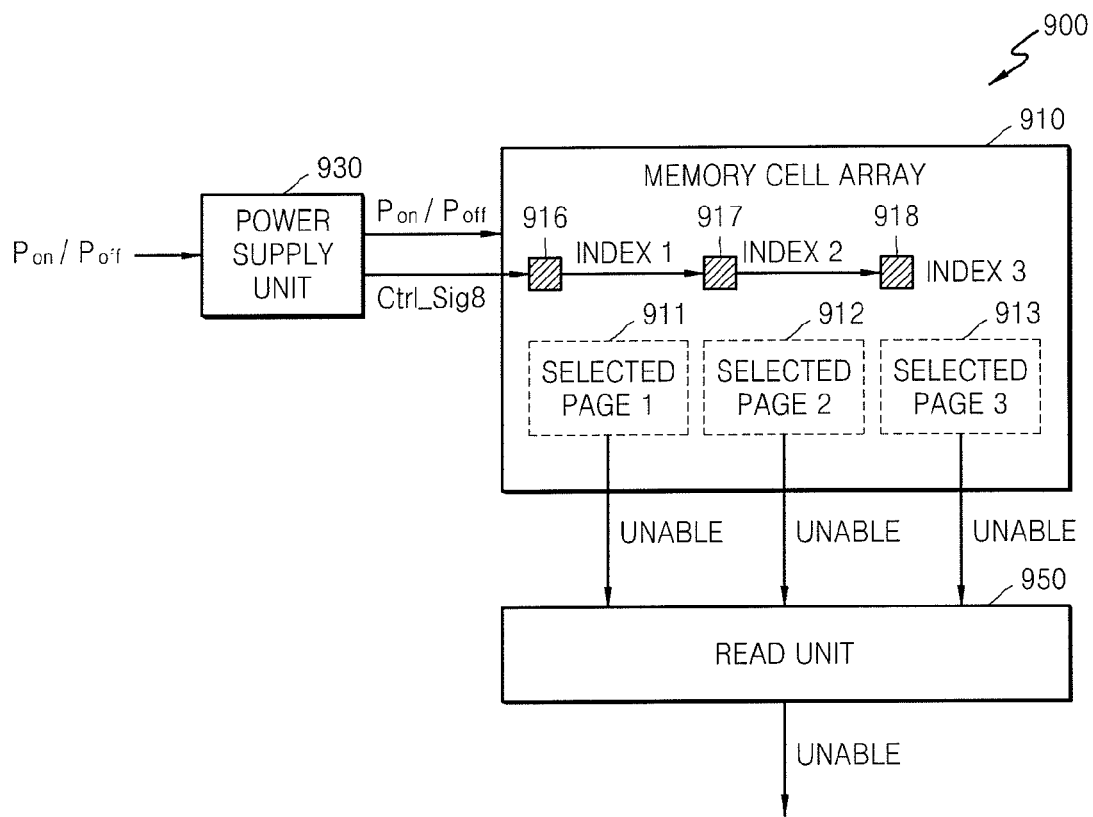
FIG. 9 is a block diagram of another embodiment of a non-volatile semiconductor memory device, according to aspects of the inventive concept.

FIG. 9 is a block diagram of another embodiment of a non-volatile semiconductor memory device 900 according to aspects of the inventive concept.

Referring to the embodiment to FIG. 9, the non-volatile semiconductor memory device 900 includes a memory cell array 910, a power supply unit 930, and a read unit 950. The memory cell array 910 of the non-volatile semiconductor memory device 900 includes index units 916 through 918. The memory cell array 910, the power supply unit 930, the read unit 950, and the index units 916 through 918 respectively perform substantially the same operations as the memory cell array 810, the power supply unit 830, the read unit 850, and the index units 816 through 818 of the embodiment of FIG. 8A. The number of index units 916 through 918 is 3 in the current embodiment, but the number of index units is not limited thereto.

The power supply unit 930 according to the current embodiment generates an eighth control signal Ctrl_Sig8 in response to the power on or off signal Pon/Poff. Like FIG. 8, the eighth control signal Ctrl_Sig8 input from the power supply unit 930 to the memory cell array 910 includes information about the index units 916 through 918. The memory cell array 910 initializes the index units 916 through 918 to "0" in response to the power on or off signal Pon/Poff. Since the index units 916 through 918 are initialized to "0", pieces of data of selected pages are suppressed or not read. Alternatively, an initialization signal Initial_Sig may initialize the index units 916 through 918 to "1". Since the index units 916 through 918 are initialized to "1", data of selected pages may be read. As such, the index units 916 through 918 may be managed together by the power on or off signal Pon/Poff.

Figure 10:
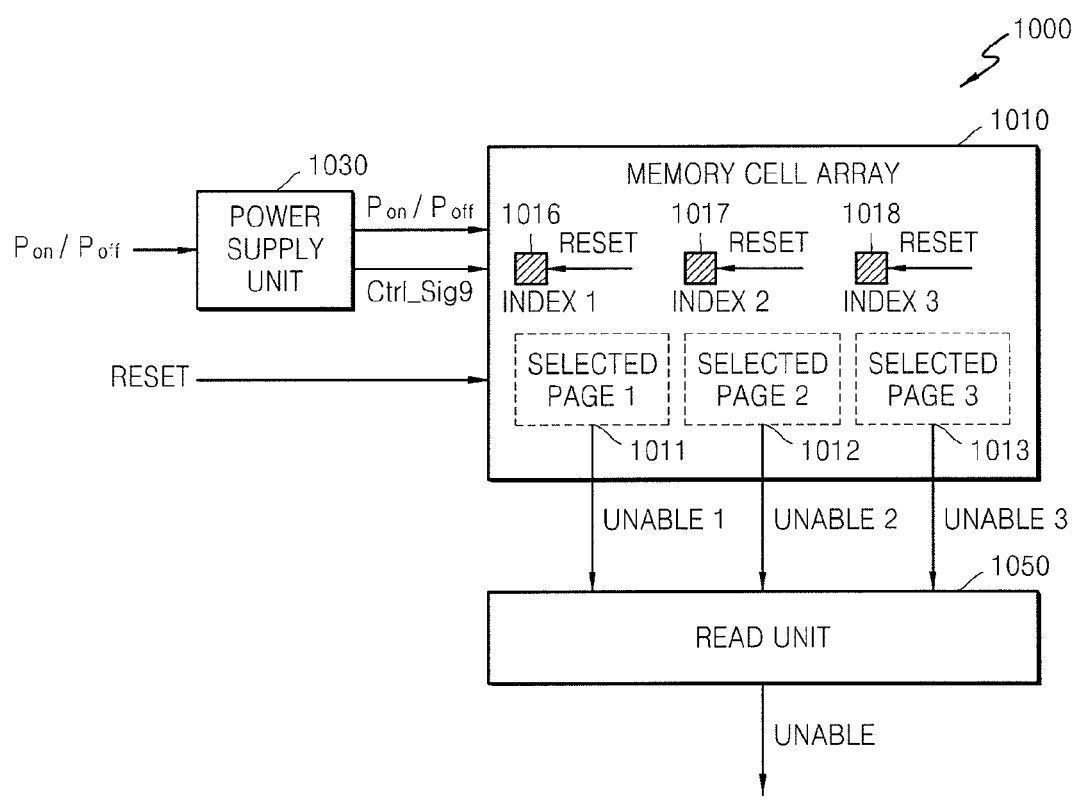
FIG. 10 is a block diagram of another embodiment of a non-volatile semiconductor memory device, according aspects of the inventive concept.

FIG. 10 is a block diagram of another embodiment of a non-volatile semiconductor memory device 1000, according to aspects of the inventive concept.

Referring to the embodiment of FIG. 10, the non-volatile semiconductor memory device 1000 includes a memory cell array 1010, a power supply unit 1030, and a read unit 1050. The memory cell array 1010 of the non-volatile semiconductor memory device 1000 includes index units 1016 through 1018. The memory cell array 1010, the power supply unit 1030, the read unit 1050, and the index units 1016 through 1018 respectively perform substantially the same operations as the memory cell array 810, the power supply unit 830, the read unit 850, and the index units 816 through 818 of the embodiment of FIG. 8A. Here, the number of index units 1016 through 1018 is 3 in the current embodiment, but the number of index units is not limited thereto. The power supply unit 1030 according to the current embodiment generates a ninth control signal Ctrl_Sig9 in response to the power on or off signal Pon/Poff. However, unlike FIG. 8A, the ninth control signal Ctrl_Sig9 input from the power supply unit 1030 to the memory cell array 1010 does not include information about the index units 1016 through 1018.

The memory cell array 1010 may receive a reset signal RESET input from a source external to the non-volatile semiconductor memory device 1000. The reset signal RESET may reset the index units 1016 through 1018. Since the index units 1016 through 1018 are reset to "0" by the reset signal RESET, data of selected pages is suppressed or not read. Alternatively, the reset signal RESET may reset the index units 1016 through 1018 to "1". Since the index units 1016 through 1018 are reset to "1", the data of selected pages may be read. As such, the index units 1016 through 1018 may be managed together by the reset signal RESET input from outside the non-volatile semiconductor memory device 1000.

Figure 11:
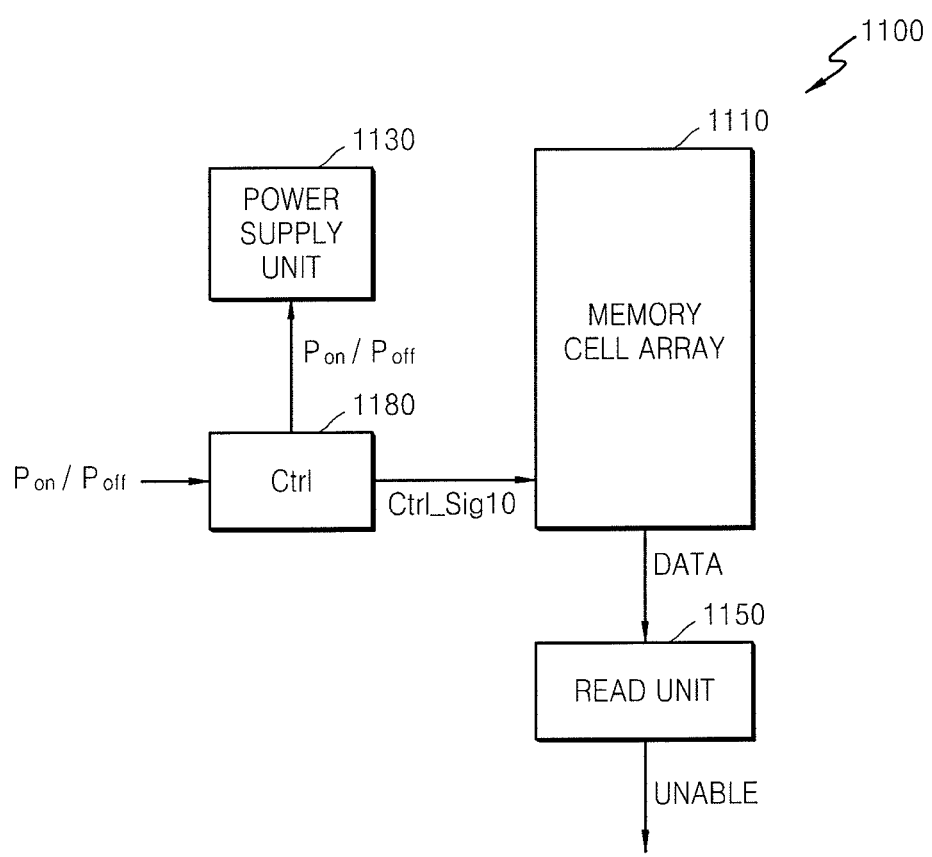
FIG. 11 is a block diagram of an embodiment of a non-volatile semiconductor memory system, according to aspects of the inventive concept

FIG. 11 is a block diagram of an embodiment of a non-volatile semiconductor memory system 1100, according to aspects of the inventive concept.

Referring to the embodiment of FIG. 11, the non-volatile semiconductor memory system 1100 includes a memory cell array 1110, a power supply unit 1130, a read unit 1150, and a controller 1180 for controlling the memory cell array 1110, the power supply unit 1130, and the read unit 1150. Upon receiving the power on or off signal Pon/Poff, the controller 1180 transmits the power on or off signal Pon/Poff to the power supply unit 1130 so that the power supply unit 1130 supplies power to the memory cell array 1110. The controller 1180 according to the current embodiment generates a tenth control signal Ctrl_Sig10 in response to the power on or off signal Pon/Poff. The controller 1180 inputs the tenth control signal Ctrl_Sig10 to the memory cell array 1110 so that data stored in the memory cell array 1110 is suppressed or not read by the read unit 1150. The controller 1180 is disposed external to the memory cell array 1110 in the current embodiment, but the controller 1180 may be disposed internal to the memory cell array 1110 in other embodiments. Also, the controller 1180 is disposed internal to the non-volatile semiconductor memory system 1100 in the current embodiment, but the controller 1180 may be disposed external to the non-volatile semiconductor memory system 1100 in other embodiments.

FIG. 12 is a block diagram of an embodiment of an electronic system 1200 including the non-volatile semiconductor memory device 100, according to an aspect of the inventive concept.

Referring to FIG. 12, the electronic system 1200 includes an input device 1210, an output device 1220, a processor device 1230, and the non-volatile semiconductor memory device 100 of the embodiment of FIG. 1A, for example. The processor device 1230 may control the input device 1210, the output device 1220, and the non-volatile semiconductor memory device 100 via a corresponding interface. The processor device 1230 may include at least one of a microprocessor, a digital signal processor, a microcontroller, and a logical device performing a similar function as thereof, as examples. The input device 1210 and the output device 1220 may include at least one selected from the group consisting of a keypad, a keyboard, touch screen, and a display device, as examples.

The non-volatile semiconductor memory device 100 of FIG. 12 may be substantially the same as that of FIGS. 1A and 1B. The non-volatile semiconductor memory device 100 may include the memory cell array 110, the power supply unit 130, and the read unit 150. The power supply unit 130 receives the power on or off signal Pon/Poff from a source external to the electronic system 1200. The power on or off signal Pon/Poff powers on or off the memory cell array 110. Here, the first control signal Ctrl_Sig1 may be input to the memory cell array 110 so that data recorded on the memory cell array 110 is suppressed or not read, thereby improving security of the non-volatile semiconductor memory device 100.

Figure 13A:
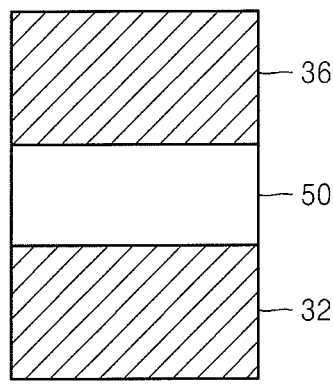
FIGS. 13A through 13C are diagrams of an embodiment of when a non-volatile semiconductor memory device other than an MRAM is used, according to aspects of the inventive concept.
Figure 13B:
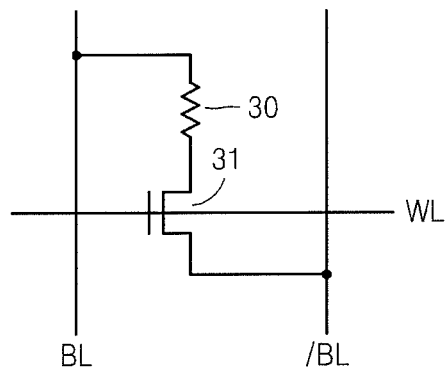
Figure 13C:
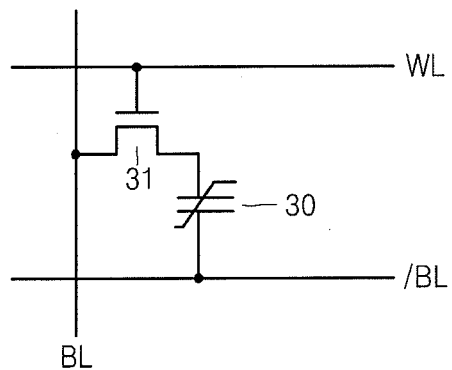

FIGS. 13A through 13C are diagrams of an embodiment of when a memory element 30 other than an MRAM is used according to various embodiments of the inventive concept.

In FIGS. 1A through 12, an MRAM is used as an example of a memory device included in a memory cell. However, another type of non-volatile memory device may be used in other embodiments. Other examples of the memory element 30 will now be described, as examples.

1. Resistance Random Access Memory (ReRAM)

An ReRAM may be used as a semiconductor memory device in some embodiments, rather than an MRAM. In this case, a resistance-change element is used as the memory element 30. FIG. 13A is a cross-sectional view of the resistance-change element used as memory element 30.

The memory element 30 includes a lower electrode 32, an upper electrode 36, and a write layer (resistance-change layer) 50 disposed between the lower electrode 32 and the upper electrode 36. A Perovskite oxide film or a binary-series transition metal oxide film, as examples, can be used as the write layer 50. $Pr_{0.7}Ca_{0.3}MnO_3$, $SrZrO_3/SrTiO_3$, or $Pb(Zr,Ti)O_3/Zn_{0.4}Cd_{0.6}S$ may be used as the Perovskite oxide film, and NiO, TiN, $TiO_2$, $HfO_2$, or $ZrO_2$ may be used as the binary-series transition metal oxide film, in various embodiments.

Resistance of the write layer 50 changes due to application of a voltage pulse. The write layer 50 has a high resistance state (reset state) and a low resistance state (set state), and selectively moves to one of the states according to the application of a voltage pulse.

In other words, assume that a voltage moving the write layer 50 from the high resistance state to the low resistance state is a set voltage Vset, and a voltage moving the write layer 50 from the low resistance state to the high resistance state is a reset voltage Vreset. Then, the set voltage Vset is set as a positive bias for applying a positive voltage to the upper electrode 36 with respect to the lower electrode 32, and the reset voltage Vreset is set as a negative bias for applying a negative voltage to the upper electrode 36 with respect to the lower electrode 32. Accordingly, the memory element 30 of the embodiment of FIG. 13A may store 1 bit data by setting the low resistance state and the high resistance state respectively according to data of "0" and "1".

During a data reading operation, a low voltage of about 1/1000 to 1/4 times of the reset voltage Vreset is supplied to the memory element 30, and then data may be read by detecting a current change at the time when Vreset is applied.

2. PRAM: Phase-Change Random Access Memory (PRAM)

A PRAM may be used as a semiconductor memory device in some embodiments, rather than an MRAM. In this case, a phase-change element is used as the memory element 30. In this embodiment, a cross-section of the memory element 30 as a phase-change element is the same as that of the resistance-change element of FIG. 13A.

Using the embodiment of FIG. 13A, the memory element 30 in this embodiment includes the lower electrode 32, the upper electrode 36, and the write layer (phase-change layer) 50 disposed therebetween. A phase of the write layer 50 changes from a crystalline state to an amorphous state or from an amorphous state to a crystalline state due to heat that is generated as a current is transferred from the upper electrode 36 to the lower electrode 32. Resistance of the write layer 50 is low in the crystalline state (low resistance state) and is high in the amorphous state (high resistance state).

A chalcogen compound, such as Ge—Sb—Te, In—Sb—Te, Ag—In—Sb—Te, or Ge—Sn—Te, as examples, may be used as a material for the write layer 50. Such materials are used to obtain stability and reliability during high speed switching operations and repeated recording.

FIG. 13B is an embodiment of a circuit diagram of a memory cell using the memory element 30 as the phase-change element described above. One terminal of the memory element 30 is connected to a bit line BL, and the other end of the memory element 30 is connected to a drain of a selection transistor 31. A source of the selection transistor 31 is connected to a bit line/BL, and a gate of the selection transistor 31 is connected to a word line WL.

An embodiment of an operation of recording data on a memory cell including the memory element 30 being a phase-change element, and the selection transistor 31 will now be described. First, a pulse-shaped current is applied to the write layer 50. The write layer 50 is heated due to application of a current pulse. A current value of the current pulse sets a temperature of the write layer 50 to be equal to or higher than a crystallization temperature threshold value (TH). The write layer 50 changes from the crystallization state to the amorphous state at the crystallization temperature threshold value TH. The temperature of the write layer 50 heated due to the application of a current pulse is quickly decreased after the application of a current pulse. At that time, the write layer 50 is set to the amorphous state (high resistance state).

After the pulse-shaped current, a small current, of which a current value decreases, is applied to the write layer 50. At that time, the temperature of the write layer 50 heated due to the application of a current pulse is decreased, but since the small current is applied, the temperature gradually decreases. Here, the write layer 50 is set to the crystalline state (low resistance state).

In other words, due to the application of a current, the write layer 50 is heated to a temperature equal to or higher than the crystalline temperature threshold value TH. Accordingly, when a temperature head near the crystalline temperature threshold value TH is small, the write layer 50 is set to the crystalline state (low resistance state), and when the temperature head near the crystalline temperature threshold value TH is large according to a drop condition of the applied current pulse, the write layer 50 is set to the amorphous state (high resistance state).

Next, the case where the write layer 50 is set to the amorphous state (high resistance state) is defined as "1" data, and the case where the write layer 50 is set to the crystalline state (low resistance state) is defined as "0" data, thereby recording 1 bit information on the memory cell. A data reading operation is identical to that of a magnetic resistance element.

3. Ferroelectric Random Access Memory (FeRAM)

An FeRAM may be used as a semiconductor memory device in some embodiments, rather than an MRAM. Here, a memory cell includes a ferroelectric capacitor as the memory element 30 and the selection transistor 31. A cross-sectional view of the memory element 30 as the ferroelectric capacitor is the same as is shown in FIG. 13A.

Using FIG. 13A as an example, the memory element 30 includes the lower electrode 32, the upper electrode 36, and the write layer 50 as a ferroelectric film disposed there between. Here, a $PZT[Pb(Zr_xT_{1-x})O_3]$ or $SBT(SrBi_2Ta_2O_9)$ can be used as the write layer 50, as examples.

A ferroelectric material is a dielectric material of which a spontaneous polarization direction is changed by applying a voltage and is maintained after application of the voltage is stopped. A ferroelectric capacitor may be used as the memory element 30 by setting two polarized states of the ferroelectric capacitor respectively according to data of "0" and "1".

FIG. 13C is an embodiment of a circuit diagram of a memory cell using a ferroelectric capacitor as the memory element 30. The drain of the selection transistor 31 is connected to the bit line BL, and the gate of the selection transistor 31 is connected to the word line WL. One terminal of the memory element 30 is connected to the source of the selection transistor 31, and the other terminal of the memory element 30 is connected to the bit line/BL.

Same effects as those shown in the embodiments described with reference to FIGS. 1A through 12 may be obtained by using the memory element 30.

Figure 14:
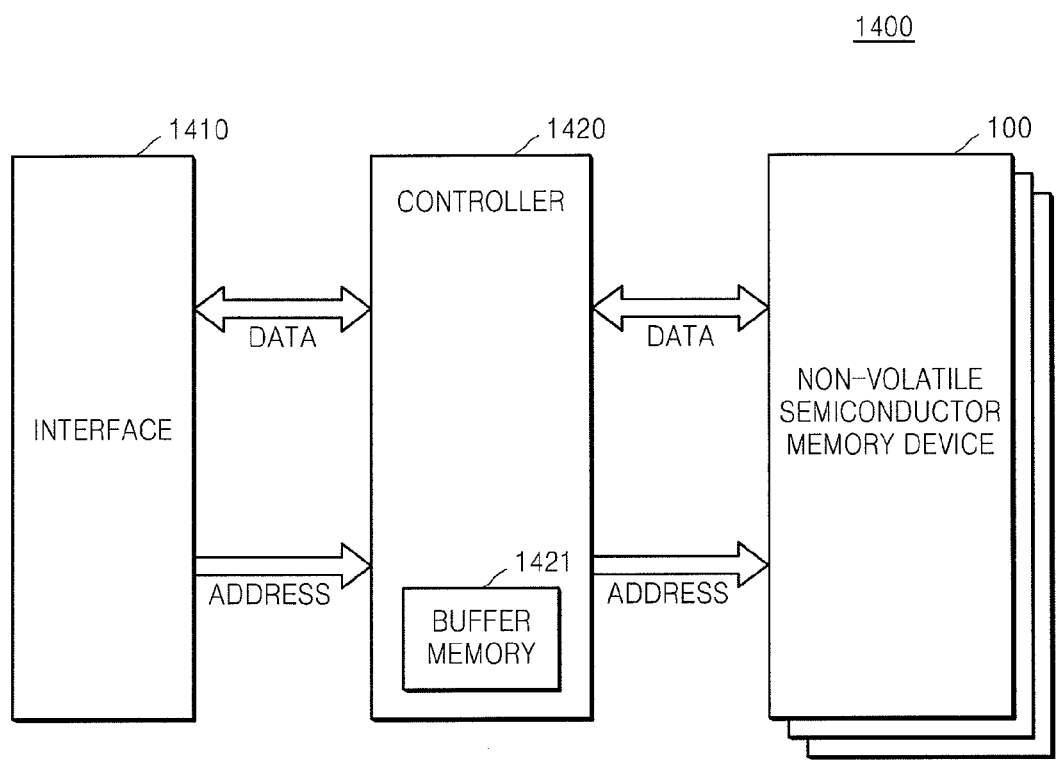
FIG. 14 is a block diagram of an embodiment of a memory system using a non-volatile semiconductor memory device, according to aspects of the inventive concept.

FIG. 14 is a block diagram of an embodiment of a memory system 1400 using the non-volatile semiconductor memory device 100, as an example, according to an aspect of the inventive concept.

Referring to the embodiment of FIG. 14, the memory system 1400 may include an interface 1410, a controller 1420, and the non-volatile semiconductor memory device 100, as an example. The interface 1410 may provide interfacing between the memory system 1400 and a host (not shown). The interface 1410 may include a data exchanging protocol corresponding to the host for interfacing with the host, for one or more hosts. The interface 1410 may be configured to communicate with the host through one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), and integrated drive electronics (IDE).

The controller 1420 may receive data and address information provided from the host through the interface 1410. The controller 1420 may access the non-volatile semiconductor memory device 100 by referring to the data and address provided from the host. The controller 1420 may transfer data read from the non-volatile semiconductor memory device 100 to the host through the interface 1410.

The controller 1420 may include a buffer memory 1421. The buffer memory 1421 temporarily stores write data provided from the host or the data read from the non-volatile semiconductor memory device 100. When data existing in the non-volatile semiconductor memory device 100 is cached during a read request of the host, the buffer memory 1421 provides a cache function for providing the cached data directly to the host. Generally, a data transmission speed according to a bus format, such as SATA or SAS, of the host may be relatively high compared to a transmission speed of a memory channel in the memory system 1400. In other words, when an interface speed of the host is remarkably high, the buffer memory 1421 is used to decrease the performance deterioration caused by a speed difference.

The non-volatile semiconductor memory device 100 may be provided as a storage medium of the memory system 1400. For example, the non-volatile semiconductor memory device 100 may be realized as an MRAM. Alternatively, the non-volatile semiconductor memory device 100 may be realized as a NAND-type flash memory having high capacity. The non-volatile semiconductor memory device 100 may include a plurality of memories. The non-volatile semiconductor memory device 100 may be a PRAM, MRAM, ReRAM, FRAM, or NOR flash memory, or may be a memory system in which two different types of memory devices are used together, as examples.

Figure 15:
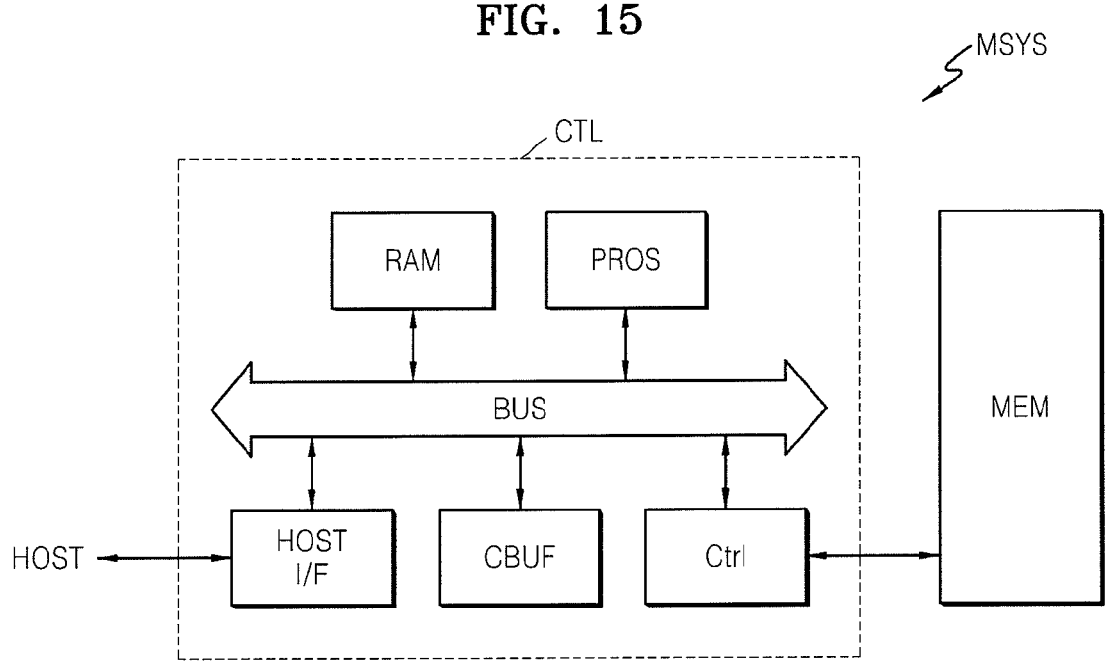
FIG. 15 is a block diagram of an embodiment of a semiconductor memory system, according to aspects of the inventive concept.

FIG. 15 is a block diagram of an embodiment of a semiconductor memory system MSYS, according to an aspect of the inventive concept.

Referring to the embodiment of FIG. 15, the semiconductor memory system MSYS includes a controller CTL and a memory device MEM. The memory device MEM may be a memory device according to an embodiment described herein. The controller CTL may include a processor PROS, a ram RAM, a cache buffer CBUF, and a memory controller CTRL, as examples, which are connected to a bus BUS. The processor PROS controls the memory controller CTRL to transfer data with the memory device in response to a request (command, address, or data) of a host. The processor PROS and the memory controller CTRL according to the current embodiment may be realized as one advanced RISC machine (ARM) processor, in some embodiments. Data required to operate the processor PROS may be loaded on the RAM, or other accessible memory.

A host interface HOST I/F receives and then transmits a request of the host to the processor PROS, or transmits data from the memory device MEM to the host. The host interface HOST I/F interfaces with the host and is one of various interface protocols, such as USB, MMC, PCI-E, SATA, PATA, SCSI, ESDI, and IDE, as examples. Data to be transmitted to the memory device MEM or received from the memory device MEM may be temporarily stored in the cache buffer CBUF.

A semiconductor memory device according to aspects of the present invention, such as those embodied in the examples provided herein, may be installed by using a package having one of various shapes. For example, the semiconductor memory device may be installed by using one of presently known or hereafter developed types of packages, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated chip (SOIC), shrink small outline package (SSOP), thin small outline package (TSOP), thin quad flat pack (TQFP), system in package (SIP), multi chip package (MCP), wafer-level fabricated package (WFP), and wafer-level processed stack package (WSP).

Figure 16:
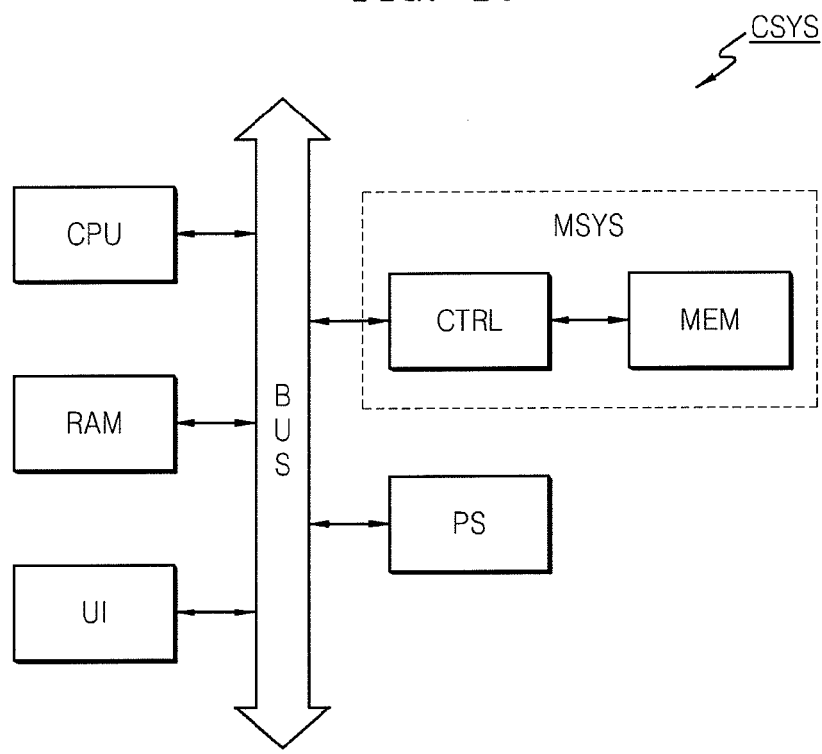
FIG. 16 is a block diagram of an embodiment of a computing system including a semiconductor memory system, according to aspects of the inventive concept.

FIG. 16 is a block diagram of an embodiment of a computing system CSYS including the semiconductor memory system MSYS, according to aspects of the inventive concept.

Referring to the embodiment of FIG. 16, the computing system CSYS according to this embodiment includes a processor CPU, a system memory RAM, and the semiconductor memory system MSYS, which are electrically connected to a bus BUS. The semiconductor memory system MSYS includes a memory controller CTRL and a memory device MEM. The memory device MEM may be the non-volatile semiconductor memory device 100 according to various embodiments. The semiconductor memory system MSYS of the embodiment of FIG. 16 may be the non-volatile semiconductor memory system 1100 of FIG. 11, as an example. Also, the computing system CSYS of the embodiment of FIG. 16 may further include a user interface UI and a power supply device PS, which are electrically connected to the bus BUS.

If the computing system CSYS is a mobile device (e.g., a mobile phone), the computing system CSYS may further include a battery for supplying an operating voltage of the computing system CSYS, and a modem, such as a baseband chipset. In addition, the computing system CSYS may further include an application chipset, a camera image processor (CIS), or a mobile DRAM.

Figure 17:
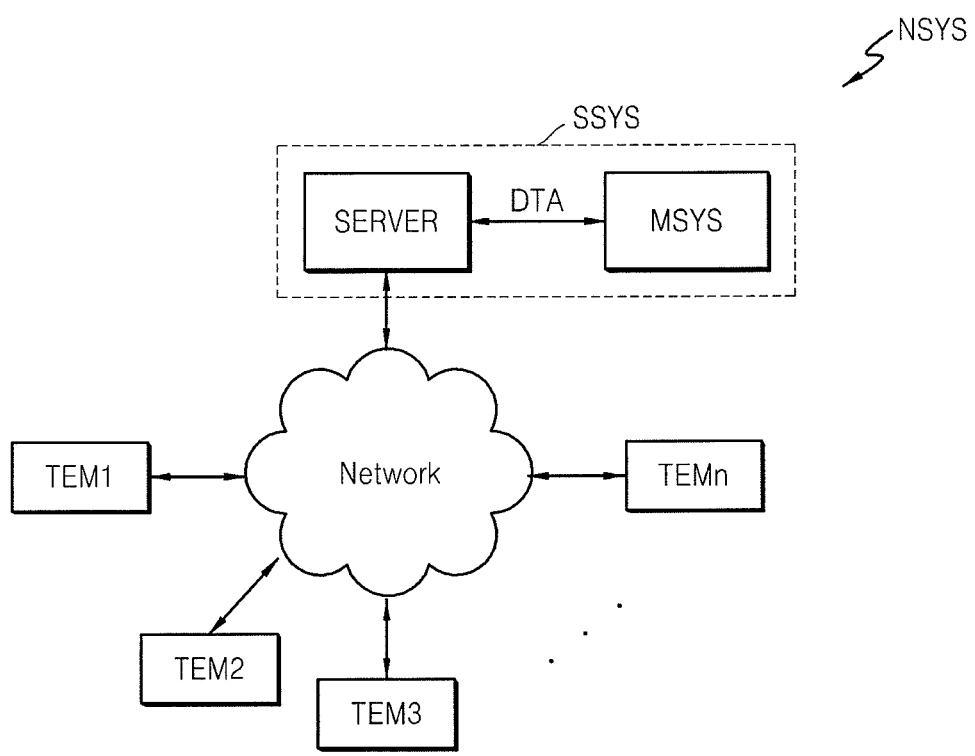
FIG. 17 is a diagram showing an embodiment of a network system and a server system including a semiconductor memory system, according to aspects of the inventive concept.

FIG. 17 is a diagram showing an embodiment of a network system NSYS and a server system SSYS including a semiconductor memory system MSYS, according to an aspect of the inventive concept.

Referring to the embodiment of FIG. 17, the network system NSYS may include the server system SSYS connected or coupled together via a network and a plurality of terminals ATEM1 through TEMn. The server system SSYS according to the current embodiment may include a server SERVER comprising one or more computer processors for processing a request received from the terminals TEM1 through TEMn connected to the network, and the semiconductor memory system MSYS for storing data corresponding to the data received from the terminals TEM1 through TEMn. Here, the semiconductor memory system MSYS of the embodiment of FIG. 17 may be the non-volatile semiconductor memory system 1100 of the embodiment of FIG. 11, as an example.

While the inventive concept has been taught with respect to various embodiments particularly shown and described herein, it will be understood that various changes in form and details may be made therein without departing from the spirit and scope of the inventive concept. It is intended by the following claims to claim that which is literally described and all equivalents thereto, including all modifications and variations that fall within the scope of each claim.

What is claimed is:

1. A non-volatile semiconductor memory device comprising:
   a power supply unit configured to output a control signal in response to a power on or off signal;
   a memory cell array configured to be powered on and off by the power on or off signal and to receive the control signal; and
   a read unit configured to read data recorded in the memory cell array, wherein the read unit is also configured to:
      suppress output of at least some data recorded in the memory cell array when the control signal has a first value in combination with the power on or off signal, and
      not to suppress output of data recorded in the memory cell when the control signal has a second value in combination with the power on or off signal.

2. The non-volatile semiconductor memory device of claim 1, wherein the non-volatile semiconductor memory device is a magnetic random access memory (MRAM).

3. The non-volatile semiconductor memory device of claim 1, wherein the memory cell array is configured to delete at least some of the data recorded in the memory cell array in response to the control signal in combination with the power on or off signal.

4. The non-volatile semiconductor memory device of claim 3, further comprising a buffer coupled to the memory cell array, wherein the data deleted from the memory cell array is stored in the buffer in response to the control signal in combination with the power on or off signal.

5. The non-volatile semiconductor memory device of claim 1, wherein data having a predetermined pattern is recorded in the non-volatile semiconductor memory device in response to the control signal in combination with the power on or off signal.

6. The non-volatile semiconductor memory device of claim 5, wherein the memory cell array is configured to suppress reading of the data recorded in the memory cell array when the data having the predetermined pattern is output by the memory cell array in response to the control signal in combination with the power on or off signal.

7. The non-volatile semiconductor memory device of claim 1, wherein only a part of the data recorded in the memory cell array is suppressed from being read in response to the control signal in combination with the power on or off signal.

8. The non-volatile semiconductor memory device of claim 1, further comprising:
   a plurality of index units, wherein each of the plurality of index units is configured to indicate a certain region of the memory cell array and each certain region of the memory cell array corresponds to a value indicated in each of the plurality of index units, and thus data recorded on the certain region of the memory cell array is not read.

9. The non-volatile semiconductor memory device of claim 8, wherein the plurality of index units are initialized by a signal generated by the memory cell array in response to the power on or off signal.

10. The non-volatile semiconductor memory device of claim 8, wherein the plurality of index units are initialized by an external signal.

11. The non-volatile semiconductor memory device of claim 8, wherein the plurality of index units indicates a page unit in the memory cell array.

12. A non-volatile semiconductor memory system comprising:
   a power supply unit;
   a memory cell array configured to be powered on or off by the power supply unit;
   a read unit configured to read data recorded on the memory cell array; and
   a controller configured to control the power supply unit and the memory cell array and to output a control signal in response to a power on or off signal,
   wherein the read unit is also configured to:
      suppress output of at least some of the data recorded in the memory cell array when the control signal has a first value, and
      to output the data recorded in the memory cell when the control signal has a second value.

13. The non-volatile semiconductor memory system of claim 12, wherein the memory cell array is configured to delete at least some of the data recorded in the memory cell array in response to the control signal when the memory cell array is powered on or off.

14. The non-volatile semiconductor memory system of claim 12, wherein:
   data having a predetermined pattern is recorded in the non-volatile semiconductor memory device; and
   the memory cell array is configured to suppress reading of the data recorded in the memory cell array when the data having a predetermined pattern is output by the memory cell array in response to the control signal, when the memory cell array is powered on or off.

15. The non-volatile semiconductor memory system of claim 12, further comprising a plurality of index units, wherein each of the plurality of index units is configured to indicate a certain region of the memory cell array and each certain region of the memory cell array corresponds to a value indicated in each of the plurality of index units, and thus reading of data recorded on the certain region of the memory cell array is suppressed.

16. A method of preventing the reading of data from a non-volatile semiconductor memory device during power on and power off, the method comprising:
   providing a non-volatile semiconductor device including a power supply unit, a memory cell array configured to be powered on and off by the power supply unit, and a read unit configured to read data recorded in the memory cell array;
   recording data in the memory cell array;
   generating a control signal in response to a power on or off signal indicating the memory cell array being powered on or off; and
   suppressing reading of at least some of the data recorded in the memory cell array in response to the control signal having a first value provided in combination with the power on or off signal; and
   outputting the at least some of the data recorded in the memory cell array in response to the control signal having a second value provided in combination with the power on or off signal.

17. The method of claim 16, wherein the non-volatile semiconductor memory device is a magnetic random access memory (MRAM).

18. The method of claim 16, further comprising:
suppressing the reading of the data recorded in the memory cell array when deleting at least some of the data from the memory cell array, when the memory cell array is powered on or off.

19. The method of claim 16, further comprising:
storing data having a predetermined pattern in the non-volatile semiconductor memory device, when the memory cell array is powered on or off.

20. The method of claim 19, further comprising:
reading the data having the predetermined pattern while suppressing the reading of the data recorded in the memory cell array, when the memory cell array is powered on or off.

* * * * *